(12) United States Patent
Walsh

(10) Patent No.: US 8,610,478 B1
(45) Date of Patent: Dec. 17, 2013

(54) DIFFERENTIAL DELAY CELL WITH LOW POWER, LOW JITTER, AND SMALL AREA

(75) Inventor: Paul M. Walsh, Cork (IE)

(73) Assignee: Cypress Semiconductor Corporation, San Jose, CA (US)

( * ) Notice: Subject to any disclaimer, the term of this patent is extended or adjusted under 35 U.S.C. 154(b) by 971 days.

(21) Appl. No.: 11/853,144

(22) Filed: Sep. 11, 2007

Related U.S. Application Data

(60) Provisional application No. 60/826,120, filed on Sep. 19, 2006.

(51) Int. Cl.
*H03H 11/26* (2006.01)
*H03K 5/135* (2006.01)

(52) U.S. Cl.
CPC .................................. *H03K 5/135* (2013.01)
USPC ......................................................... 327/271

(58) Field of Classification Search
USPC ......... 327/261, 263, 264, 266, 268–272, 274, 327/285, 287, 288, 290, 158, 534, 535, 537
See application file for complete search history.

(56) References Cited

U.S. PATENT DOCUMENTS

| | | | |
|---|---|---|---|
| 5,525,919 A * | 6/1996 | Phelan | 327/52 |
| 5,559,476 A | 9/1996 | Zhang et al. | |
| 5,600,280 A | 2/1997 | Zhang | |
| 5,606,295 A * | 2/1997 | Ohara et al. | 331/116 FE |
| 5,638,030 A * | 6/1997 | Du | 331/57 |
| 5,903,607 A * | 5/1999 | Tailliet | 375/257 |
| 6,154,064 A * | 11/2000 | Proebsting | 327/55 |
| 6,359,473 B1 * | 3/2002 | You et al. | 327/52 |
| 6,774,694 B1 * | 8/2004 | Stern et al. | 327/276 |
| 6,980,053 B2 * | 12/2005 | Caresosa et al. | 330/254 |
| 7,135,926 B2 * | 11/2006 | Caresosa et al. | 330/254 |
| 7,233,172 B2 * | 6/2007 | Kanamori et al. | 327/55 |
| 7,345,512 B2 * | 3/2008 | Tran et al. | 327/52 |
| 2003/0076179 A1 | 4/2003 | Branch et al. | |
| 2003/0210078 A1 * | 11/2003 | Wijetunga et al. | 327/52 |
| 2004/0263227 A1 * | 12/2004 | Baker et al. | 327/158 |
| 2005/0168260 A1 * | 8/2005 | Tomerlin et al. | 327/278 |
| 2006/0087347 A1 * | 4/2006 | Sumi | 327/72 |
| 2006/0114044 A1 | 6/2006 | Mintchev et al. | |
| 2007/0075786 A1 * | 4/2007 | Maxim et al. | 331/16 |
| 2007/0097765 A1 * | 5/2007 | Huang et al. | 365/205 |
| 2008/0008263 A1 * | 1/2008 | Keerthi et al. | 375/297 |

* cited by examiner

*Primary Examiner* — Sibin Chen

(57) ABSTRACT

A delay cell architecture is provided herein with improved noise performance and increased output swing, while consuming less power and area than conventional delay cell architectures. In one embodiment, the delay cell described herein may include a pair of input transistors, a pair of cross-coupled transistors, a pair of current source transistors, at least one swing limiting transistor and an RC filter. The at least one swing limiting transistor is coupled between the output nodes of the delay cell for controlling the output swing and keeping the current source transistors in saturation. Phase-induced jitter is reduced by connecting the RC filter directly to the mutually-coupled source terminals of the current source transistors. Deterministic jitter is reduced by using a relatively large resistor and relatively small capacitor within the RC filter design. Such a design reduces the amount of area consumed by the delay cell without sacrificing noise performance. Current consumption is reduced by requiring only one bias voltage to be supplied to the delay cell.

16 Claims, 5 Drawing Sheets

| NFET MN5 | | SWING | Freq |
|---|---|---|---|
| W | L | (Rsupply=650) | |
| um | um | V | MHz |
| None | None | 1.45 | 76 |
| 0.42 | 8 | 1.416 | 76 |
| 0.42 | 4 | 1.325 | 80 |
| 0.42 | 2 | 1.185 | 86 |

DIFFERENTIAL DELAY CELL WITH LOW POWER, LOW JITTER, AND SMALL AREA

PRIORITY CLAIM

The present application claims priority to U.S. Provisional Application No. 60/826,120 filed Sep. 19, 2006.

BACKGROUND OF THE INVENTION

1. Field of the Invention

This invention relates to delay cells and, more particularly, to differential delay cells with reduced power, jitter and area. The differential delay cells may be incorporated, e.g., within a voltage controlled oscillator (VCO) of a phase locked loop (PLL) or a delay line of a delay locked loop (DLL).

2. Description of the Related Art

The following descriptions and examples are given as background only.

Phase-locked loops (PLLs) and delay-locked loops (DLLs) are routinely used for data and telecommunications, frequency synthesis, clock recovery, and similar applications. In some cases, for example, PLLs and DLLs may be used in the I/O interfaces of digital integrated circuits to hide clock distribution delays and to improve overall system timing. In general, a PLL or DLL may be used to generate one or more clocking signals that are in phase alignment with a reference clock. More specifically, a PLL is a closed-loop device that uses a voltage-controlled oscillator (VCO) to obtain accurate phase alignment between a reference signal and the clock signals generated by the PLL device. A DLL device, on the other hand, generally differs from a PLL device in that it uses a delay line, instead of a VCO, to obtain accurate phase alignment between the reference and clocking signals.

Unfortunately, the rising demand for high-speed electronics has created an increasingly noisy environment in which PLLs and DLLs must function. Deterministic noise and random noise are two examples of noise components, which may cause the output clocks of a PLL or DLL to "jitter" from their ideal timing. Deterministic noise is described herein as noise that originates from a known source, such as power supply noise or substrate noise. Examples of random noise include, but are not limited to, thermal noise and flicker noise. Jitter is undesirable because it often leads to decreased stability around the operating frequency (or "center frequency") of the PLL/DLL device. With a shrinking tolerance for jitter in the decreasing period of the output clock, the design of low jitter PLLs and DLLs has become very challenging.

Many solutions have been proposed to improve the phase noise performance of the voltage controlled oscillators (VCOs) within PLLs. As one example, phase noise (e.g., random noise generated primarily in the VCO) may be reduced by setting the loop bandwidth as high as possible. Unfortunately, the loop bandwidth is affected by many process technology factors, and as a result, is often constrained well below the lowest operating frequency needed for stability. This solution may also cause the PLL to have a narrow operating frequency range (since the loop bandwidth depends on the VCO gain). Although VCOs have recently been fabricated using CMOS technology to obtain higher operating frequencies (e.g., several Gigahertz, GHz) and to meet the increasing demand for lower cost and higher integration, phase-noise reduction remains a challenge for typical CMOS voltage controlled oscillators.

For example, CMOS LC-tank oscillators with on-chip spiral inductors have been used in the past to improve phase noise performance. Although CMOS LC-tank oscillators provide some improvement in phase noise performance, they have not been able overcome several barriers preventing them from becoming a reliable VCO. One such barrier is that the implementation of a high-quality inductor in a standard CMOS process is limited by parasitic effects and usually requires extra non-standard processing steps. Another barrier is that the LC-tank oscillator often demonstrates a narrow tuning range, causing PLL performance to be sensitive to process variations.

Unlike the LC-tank oscillator, a ring oscillator may be integrated into a standard CMOS process without requiring extra processing steps (since it does not require passive resonant elements). In addition, a wide operating range can be obtained when the ring oscillator is employed as a VCO. However, the ring oscillator is not without limitations and usually demonstrates worse phase noise performance than the LC-tank oscillator. In some cases, differential delay cells have been used within ring oscillators to reduce phase noise levels. However, conventional delay cells consume large amounts of current and area, and often fail to reduce phase noise components to acceptable levels.

As indicated above, solutions have been implemented to reduce the amount of phase noise (i.e., random noise) generated within the VCO of a PLL device. However, phase noise is not the only noise component which contributes to jitter within the PLL—deterministic noise must also be reduced. Therefore, a need remains for an improved architecture and method for reducing all noise components, which may cause a PLL or DLL to jitter from their ideal timing. Such noise components may include, for example, random and deterministic noise. In one preferred embodiment, an improved delay cell architecture, which consumes less current and area and provides better jitter performance than conventional delay cell architectures, is desired. Such a delay cell architecture may enable a PLL or DLL device to meet (and/or exceed) the current, area and jitter specifications required for optimal operation of the PLL or DLL device.

SUMMARY OF THE INVENTION

The following description of various embodiments of differential delay cells, phase locked loops (PLLs) and delay locked loops (DLLs) is not to be construed in any way as limiting the subject matter of the appended claims.

As described in more detail below, a delay cell architecture is provided herein with better noise performance (i.e., reduced deterministic and phase-induced jitter), increased output swing and with less power and area consumption than conventional delay cell architectures.

According to one embodiment, the delay cell architecture may include a pair of input transistors, a pair of cross-coupled transistors, a pair of current source transistors and at least one swing limiting transistor. Each of the input transistors may be coupled to a different one of the output nodes for generating a pair of output signals based on the input signals supplied to the input nodes of the delay cell. Each of the cross-coupled transistors may be coupled between a different one of the input transistors and ground for amplifying the output signals generated at the output nodes.

The current source transistors may also be coupled to the output nodes of the delay cell. For example, each of the current source transistors may have a drain terminal, which is coupled to a different one of the output nodes. The gate terminals of the current source transistors may be coupled together for receiving a first bias voltage, which is programmable for controlling current flow through the current source transistors and setting an operating frequency range of the delay cell. In some cases, the bulk terminals of the current source transistors may be coupled together for receiving a second bias voltage, which is programmable for adjusting the operating frequency range of the delay cell.

As noted above, at least one swing limiting transistor may be coupled between the drain terminals of the current source transistors. In one embodiment, a single swing limiting transistor may be coupled between the drain terminals of the current source transistors. In another embodiment, the single swing limiting device may be replaced with two back to back diode-connected swing limiting devices. The swing limiting transistor(s) may be included, for example, to control the output swing of the delay cell and to keep the current source transistors in saturation.

In some cases, an RC filter may be coupled to the delay cell architecture to reduce the amount of noise supplied thereto. For example, the RC filter may be connected between the power supply bus and the mutually-coupled source terminals of the current source transistors for supplying a reduced power supply voltage thereto. In some cases, the RC filter may also be connected to the gate terminal of the single swing limiting transistor.

The RC filter may be implemented in a variety of ways. In some cases, the RC filter may include a resistor and a capacitor. To improve deterministic noise performance, the RC filter may include a relatively large resistor and relatively small capacitor. As known in the art, increasing the RC product reduces the cut-off frequency of the low pass RC filter. For a given C, a larger R may be used to reduce the cut-off frequency and improve noise rejection. In some cases, a relatively large resistor may be used to reduce the amount of area consumed by the delay cell (e.g., up to about 58% less area), while providing up to 90% less deterministic jitter in the generated output signals. Reduced current consumption (e.g., up to about 23% less current) and phase-induced jitter (e.g., up to 7% less phase jitter) may also be provided by removing an additional current source, which is typically coupled between the RC filter and the first and second current source transistors.

In some cases, the RC components mentioned above may be used along with a native follower device and an additional capacitor. The native follower device may have: (i) a gate terminal coupled for receiving a filtered power supply voltage from the relatively large resistor and the relatively small capacitor, (ii) a drain terminal coupled for receiving the power supply voltage, and (iii) a source terminal coupled for supplying the reduced power supply voltage to the source terminals of the current source transistors. In some cases, the additional capacitor may be coupled between the source terminal of the native follower device and ground. The native follower device and the additional capacitor may used, for example, when additional filtering is desired.

According to another embodiment, the delay cell architecture may include: (i) a first current leg consisting essentially of a first current source transistor, a first input transistor and a first load transistor connected in series between an RC filter and ground, and (ii) a second current leg consisting essentially of a second current source transistor, a second input transistor and a second load transistor connected in series between the RC filter and ground. The RC filter may be implemented as described above. In some cases, a single swing limiting transistor may be coupled in parallel between the first and second current legs. In other cases, the single swing limiting transistor may be replaced with a pair of diode-connected swing limiting transistors, as mentioned above.

The first and second current source transistors may include: (i) source terminals, each of which is connected to the RC filter for receiving the filtered power supply voltage, (ii) drain terminals, each of which is connected to a drain terminal of a different one of the first and second input transistors, and (iii) gate terminals, which are coupled together for receiving a programmable bias voltage. The programmable bias voltage may be supplied to mutually-coupled gate terminals of the first and second current source transistors for controlling current flow through the first and second current legs and for setting an operating frequency range of the differential delay cell. In some cases, an additional programmable bias voltage may be supplied to mutually-coupled bulk terminals of the first and second current source transistors for adjusting the operating frequency range of the differential delay cell.

The first and second input transistors may include: (i) drain terminals, each of which is connected to a drain terminal of a different one of the first and second current source transistors, (ii) source terminals, each of is connected to a drain terminal of a different one of the first and second load transistors, and (iii) gate terminals, each of which is coupled for receiving a differential input signal supplied to the differential delay cell. The first and second load transistors may include: (i) drain terminals, each of which is connected to a source terminal of a different one of the first and second input transistors, (ii) source terminals, which are coupled together and connected to ground, and (iii) gate terminals, which are cross-coupled and connected to the drain terminals of the first and second input transistors.

In some embodiments, the delay cell architecture described herein may be incorporated within the voltage controlled oscillator (VCO) of a phase locked loop (PLL) or the delay line of a delay locked loop (DLL) device. For example, the VCO or delay line (hereinafter referred to as the circuit) may include a plurality of differential delay cells, which are coupled for receiving a filtered power supply voltage from an RC filter. The differential delay cells may be configured as described above. For example, each delay cell may include a pair of current source transistors and at least one swing limiting transistor. The pair of current sources may have mutually-coupled source terminals connected to the RC filter and mutually-coupled gate terminals connected to a bias voltage. Each of the current sources may have a drain terminal connected to a different output node of the delay cell.

The at least one swing limiting transistor may be connected between the drain terminals of the current source transistors. In some cases, a gate terminal of the at least one swing limiting transistor may be connected to the RC filter for receiving the filtered power supply voltage. In other cases, the at least one swing limiting transistor may include a pair of diode-connected transistors coupled in parallel between the drain terminals of the current source transistors. The RC filter may be configured as described above. In some cases, the RC filter may include a resistor and a capacitor. In other cases, the RC filter may also include a native follower device and an additional capacitor.

The circuit may also include a bias generation block, which is coupled for supplying the bias voltage to the mutually-coupled gate terminals of the current source transistors. The bias voltage may be used for controlling current flow through each of the delay cells, and as a result, setting an operating frequency range of the circuit. In some cases, the bias generation block may generate only one additional bias voltage, which is supplied to bulk terminals of the current source transistors for adjusting the operating frequency range of the circuit.

BRIEF DESCRIPTION OF THE DRAWINGS

Other objects and advantages of the invention will become apparent upon reading the following detailed description and upon reference to the accompanying drawings in which.

Figure 1:
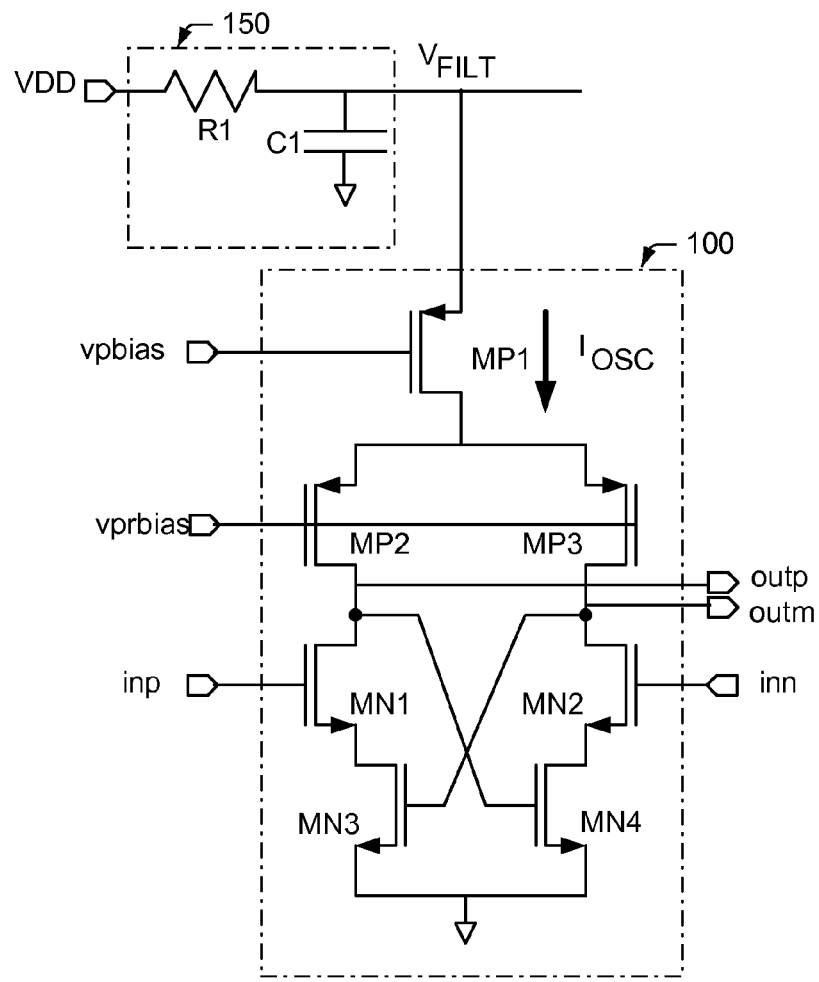
FIG. 1 is a simplified circuit schematic illustrating a differential delay cell.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

One embodiment of a low power differential delay cell 100 with programmable gain, frequency range and output swing is shown in FIG. 1. As illustrated, delay cell 100 includes a pair of input transistors (MN1, MN2), a pair of cross-coupled transistors (MN3, MN4), a pair of swing limiting transistors (MP2 and MP3) and a current source transistor (MP1). In some embodiments, delay cell 100 may be implemented with metal oxide semiconductor (MOS) transistors, as shown in FIG. 1. For example, the input and cross-coupled transistors may be implemented with NMOS transistors, while the current source and swing limiting transistors are implemented with PMOS transistors. However, delay cell 100 is not limited to MOS technology and may be alternatively implemented with other process technologies (e.g., bipolar).

During operation, a pair of differential input signals (inn, inp) is supplied to the gate terminals of the input transistors (MN1 and MN2). The potential difference between the input signals is amplified by the cross-coupled transistors (MN3 and MN4) and output from the output nodes (outp, outm) of the delay cell. A first bias voltage (vprbias) is supplied to the gate terminals of the swing limiting devices (MP2 and MP3) to ensure that the current source (MP1) remains in saturation. In some cases, the first bias voltage (vprbias) may be adjusted to vary the swing of the output signals generated by the delay cell. A second bias voltage (vpbias) is supplied to the gate terminal of the current source (MP1) for controlling the delay cell current ($I_{OSC}$), which in turn, controls the frequency of oscillation ($F_{OSC}$) within delay cell 100. In some cases, the second bias voltage (vpbias) may be adjusted to provide low power operation (by controlling the delay cell current), as well as programmable gain, frequency range and output swing for the delay cell.

Figure 2:
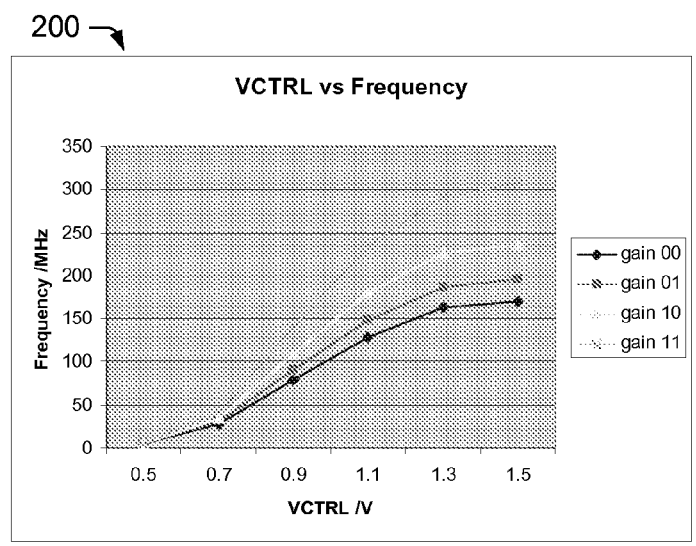
FIG. 2 is a graph illustrating an exemplary voltage vs. frequency characteristic of the delay cell of FIG. 1.

Graph 200 shown in FIG. 2 illustrates exemplary control voltage ($V_{CTRL}$) versus frequency characteristics of delay cell 100 over a plurality of programmable gain settings (00 to 11). The control voltage ($V_{CTRL}$) shown in FIG. 2 corresponds to the voltage (e.g., vpbias), which controls the frequency of oscillation in the delay cell. The delay cell gain settings are adjusted by increasing or decreasing the bias voltage (vpbias) supplied to the current source (MP1) shown in FIG. 1. As indicated in FIG. 2, the slope of the V-F curve increases with each increase in programmable gain setting. The increase in slope increases the output swing and frequency range of the delay cell, and is a direct result of the increase in the delay cell gain provided by decreasing the bias voltage (vpbias) supplied to the current source (MP1).

The delay cell architecture shown in FIG. 1 provides many advantages over conventional delay cell architectures. For example, the delay cell shown in FIG. 1 provides programmable gain, frequency range and output swing, and can be configured for low power operation. The flexibility afforded to delay cell 100 is desirable in many applications, including PLL and DLL applications. For example, the programmable gain attributed to delay cell 100 can be used in a PLL to adjust the stability of the loop, adjust the operating frequency range of the VCO or to improve PLL jitter. In addition, the programmable output swing can be reduced to increase the frequency range or increased to reduce phase noise.

However, the delay cell architecture shown in FIG. 1 may not be desired in all applications. For instance, delay cell 100 may sometimes fail to meet one or more design specifications of an electronic device (such as a PLL or DLL) incorporating the delay cell. The design specifications may include, but are not limited to, current consumption, output swing and various noise specifications (including random and deterministic sources). As described in more detail below, the failure to meet these specifications may stem, for example, from the PMOS current source (MP1) used in the delay cell architecture.

In some cases, delay cell 100 may cause an electronic device to consume more than the maximum amount of current specified for that device by requiring a bias generation block (see, e.g., FIGS. 9 and 10), which must generate more than one bias voltage. As shown in FIG. 1, for example, delay cell 100 requires two separate bias voltages (vprbias and vpbias) to be supplied to the current source (MP1) and swing limiting (MP2, MP3) transistors. This complicates the design of the bias generation block and increases the amount of current it consumes. In some cases, the amount of current consumed by the bias generation block may cause the electronic device (e.g., a PLL or DLL) to consume more current than the maximum current specified for that device.

In some cases, the electronic device may fail to meet the minimum output swing and maximum noise levels specified for the device. Such failure is often attributed to the PMOS current source (MP1) used in the delay cell architecture of FIG. 1. For instance, the voltage drop ($V_{SD}$) across the source and drain terminals of the current source (MP1) consumes a relatively large amount of headroom, which limits the output swing and restricts the circuit designer's ability to suppress deterministic noise components (e.g., power supply noise). The use of a PMOS current source (MP1) also adds thermal and flicker noise to the output signals generated by the delay cell. The addition of thermal and flicker noise increases the amount of phase-induced noise generated within the delay cell and is also undesirable.

In some cases, a circuit designer may attempt to free up headroom and increase output swing by using a PMOS current source (MP1) with a large transconductance (gm). However, as set forth in EQ. 1:

$$I^2_{THERM\_NOISE\_MP1} \approx gm^{2*}(VDD-V_{PBIAS\_NOISE})^2 \quad \text{EQ. 1}$$

the thermal noise attributed to MP1 is directly proportional to the transconductance (gm) of the current source. Therefore, increasing the transconductance of the current source amplifies the thermal noise and increases the amount of phase noise imparted to the output signals.

In some cases, a circuit designer may use an RC filter to reduce high frequency deterministic noise components (such as power supply noise). For example, RC filter 150 may be coupled between the power supply bus (VDD) and delay cell components 100 to filter the power supply voltage supplied to the delay cell. The RC filter provides a low-pass filter for reducing high frequency components. The filtered power supply voltage ($V_{FILT}$) is supplied to the source terminal of the PMOS current source (MP1) included in delay cell 100. However, because the PMOS current source MP1 requires a large amount of headroom, RC filter 150 is limited to including a relatively small resistance (R1) and a relatively large capacitance (C1).

For example, a relatively small resistor (e.g., about 121 ohms, in one embodiment) may be required to satisfy the headroom requirements of delay cell 100. However, a small resistor may not provide the RC product (and thus, the low pass filter cut-off frequency) needed to reduce deterministic noise components to acceptable levels. For instance, an RC filter including a small resistor may still provide up to about 1.24 ns of deterministic noise at an oscillation frequency ($F_{OSC}$) of 24 MHz. This noise level may be far greater than the total amount of noise (e.g., less than about 800 ps at $F_{OSC}$=24 MHz) specified for an electronic device (e.g., a PLL or DLL) incorporating the delay cell. In some cases, a relatively large capacitor (e.g., about 117 pF, in one embodiment) may be used to reduce deterministic noise to acceptable levels. Unfortunately, large capacitors significantly increase the area consumed by the delay cell, oftentimes beyond the limitations of the electronic device. In one embodiment, an RC filter (150) containing a relatively small resistor and a relatively large capacitor may consume more than 100 kum² of die area. This may represent a significant portion of the area restrictions (e.g., about 120 kum²) placed on the electronic device (e.g., a PLL or DLL) incorporating the delay cell.

In some cases, the noise components generated within or supplied to the delay cell may cause the output signals to "jitter" from their ideal timing. There are generally two types of jitter: phase-induced jitter and cycle-to-cycle jitter. "Phase-induced jitter" usually contains only random jitter components and is often defined as a rapid, repeated phase perturbation resulting in the intermittent shortening or lengthening of an electronic signal. The thermal and flicker noise generated by the PMOS current source MP1 shown in FIG. 1 represents one example of a noise source, which contributes to phase-induced jitter. "Cycle-to-cycle jitter," on the other hand, is defined as the variation from one period to the next adjacent period of an electronic signal. Unlike phase-induced jitter, cycle-to-cycle jitter usually contains deterministic and random jitter components. The power supply noise supplied to the delay cell represents one example of a noise source, which contributes to cycle-to-cycle jitter.

Jitter is undesirable in PLL and DLL devices, because it leads to decreased stability around the operating frequency (or "center frequency") of the PLL/DLL device. Jitter is especially problematic in high speed PLL/DLL devices. As clock periods decrease, the tolerance for jitter also decreases, prompting the need for extremely low jitter PLLs and DLLs. As set forth below, a PLL or DLL device may meet stringent jitter specifications by reducing both phase-induced and cycle-to-cycle jitter.

Figure 3:
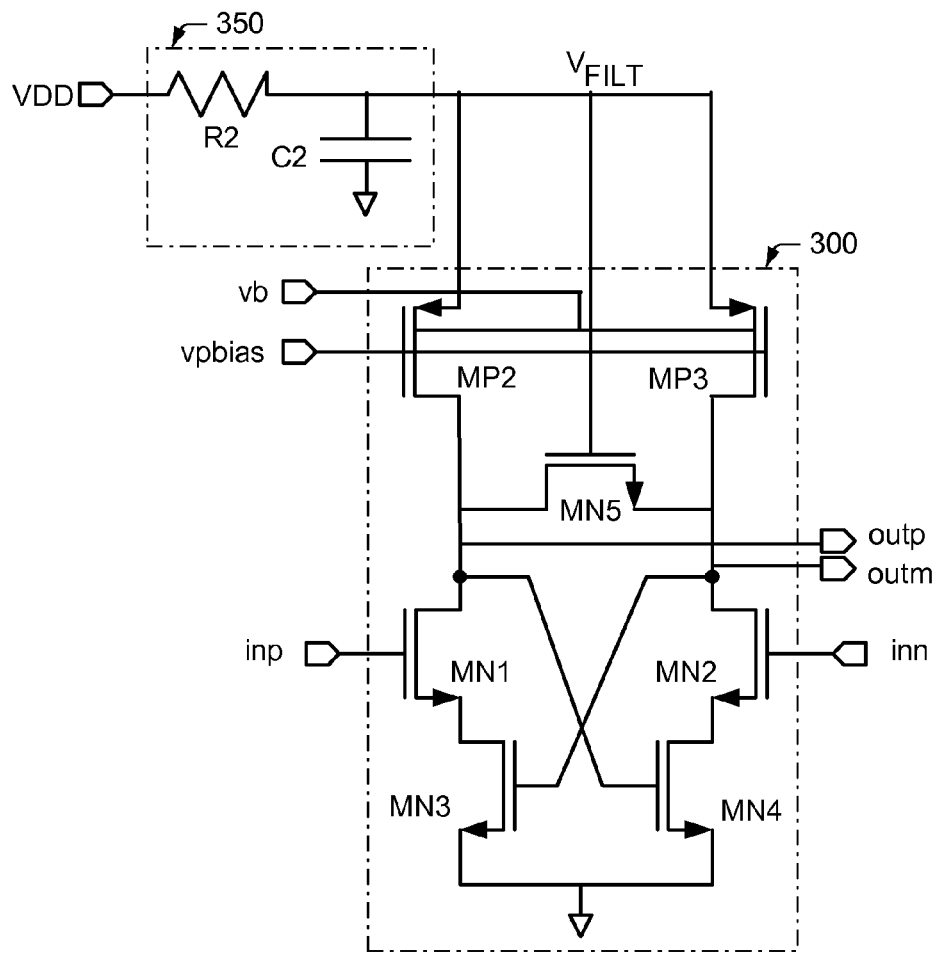
FIG. 3 is a simplified circuit schematic illustrating a differential delay cell, according to one embodiment of the invention.

FIG. 3 illustrates one embodiment of an improved delay cell 300, in accordance with one embodiment of the invention. In general, delay cell 300 differs from delay cell 100 by removing the PMOS current source (MP1) and adding an NMOS swing limiting device (MN5) between the output nodes (outp, outn) of the delay cell 300. Removing the PMOS current source (MP1) from the delay cell architecture provides many advantages. For example, removing MP1 increases the output swing of improved delay cell 300 and provides extra headroom for increasing the resistance of RC filter 350. A larger resistance in RC filter 350 reduces deterministic jitter, while consuming less area. Removing the PMOS current source (MP1) also reduces the amount of flicker and thermal noise attributed to the delay cell. This decreases the amount of phase-induced jitter imparted to the output signals. Additional advantages may become apparent in light of the description provided below.

The differential delay cell 300 shown in FIG. 3 includes many of the circuit components shown in FIG. 1 and described above. For example, delay cell 300 includes a pair of input transistors (MN1, MN2) and a pair of cross-coupled transistors (MN3, MN4), as described above in reference to FIG. 1. The input transistors are coupled for generating a pair of output signals at the output nodes (outp, outn) of the delay cell based on the pair of input signals supplied to the gate terminals of the input transistors. The cross-coupled transistors are each coupled between a different one of the input transistors and ground for amplifying the output signals generated at the output nodes. Although transistors MP2 and MP3 are also included, they act as current sources in the embodiment of FIG. 3—not swing limiting devices. As described in more detail below, the output swing is controlled by the swing limiting device (MN5) coupled between the output nodes (outp, outn) of delay cell 300. Means for adjusting the output swing will be discussed in more detail below.

As noted above, RC filter 350 may be coupled to delay cell 300 for filtering the power supply voltage (VDD) supplied to the delay cell. As shown in FIG. 3, RC filter 350 may be connected to the source terminals of the current source transistors (MP2, MP3) for supplying the filtered supply voltage ($V_{FILT}$) thereto. A bias voltage (vpbias) is supplied to the mutually-coupled gate terminals of the current source transistors for controlling the delay cell current, and thus, the frequency of oscillation within delay cell 300. In some cases, the bias voltage (vpbias) may be adjusted to provide low power operation (by controlling the delay cell current), as well as programmable gain, frequency range and output swing.

As shown in FIG. 3, the source and drain terminals of the swing limiting device (MN5) are coupled between the output nodes (outp, outm) of delay cell 300 to keep the current source transistors (MP2, MP3) in saturation and to limit the swing of the output signals. The swing limiting device (MN5) is activated when the potential difference between the output nodes exceeds the turn-on voltage of the MN5 device. Activation of the MN5 device allows a small current to flow between output nodes outp and outn. Although both output signals will swing to ground, activation of the MN5 device limits the output swing by keeping the higher of the output voltages (e.g., outp or outm) from reaching the power supply rail. In some cases, the MN5 device may be sized to provide a desired output swing, as described in more detail below.

In FIG. 3, the gate terminal of the swing limiting device (MN5) is connected to RC filter 350 for receiving the filtered supply voltage. It is worth noting, however, that the swing limiting device may not be controlled by the filtered supply voltage in all embodiments of the invention. In one alternative embodiment, the swing limiting device may be controlled by a bias voltage (not shown) supplied to its gate. As described in more detail below, the bias voltage may be used to set and/or adjust the output swing generated by the delay cell. However, an additional bias voltage would increase the current requirements of a PLL/DLL incorporating the delay cell. The swing limiting device (MN5) would also be susceptible to noise from the additional bias voltage. For these reasons, the embodiment shown in FIG. 3 may be preferred when attempting to minimize current consumption and noise susceptibility.

Like the previous embodiment, delay cell 300 combines low power operation with programmable gain, frequency range and signal swing. However, delay cell 300 improves upon delay cell 100 by removing the PMOS current source (MP1) and adding a swing limiting device (MN5) between the output terminals of the delay cell. Removing the PMOS current source increases headroom and allows a much larger resistance to be used in the RC filter. In addition to reducing deterministic jitter, the larger resistance used within the RC filter may enable the improved delay cell to meet (and/or exceed) jitter specifications with reduced area consumption and increased output swing.

For instance, the cut-off frequency (fc) of the low pass RC filter is inversely proportional to RC (e.g., fc=½πRC). Due to the extra headroom gained by removing current source MP1, a relatively large resistor (e.g., about 770 ohm, in one embodiment) and a relatively small capacitor (e.g., about 30 pF, in one embodiment) may be used to achieve a desired cut-off frequency (and thus, a desired deterministic noise level). Since on-chip capacitors consume significantly more area than on-chip resistors, the use of a large resistor and small capacitor significantly reduces the area requirements of the delay cell. In the improved embodiment, a smaller capacitor is used to save die area (e.g., more than 98 kum$^2$ of area, in one embodiment), while a larger resistor is used to achieve the desired noise level.

Although alternative resistive and capacitive values may be used, one skilled in the art would recognize that the RC filter of FIG. 3 reduces the area requirements of the delay cell by increasing the resistance rather than the capacitance. In some cases, the RC filter of FIG. 3 may enable delay cell 300 to provide significantly larger output swings than delay cell 100. In one embodiment, delay cell 300 may provide 21% larger output swings than delay cell 100, even with the inclusion of a 770 ohm resistor. It is noted, however, that RC filter 350 is not limited to the exemplary resistive and capacitive values mentioned herein. In some embodiments, smaller resistors may be used to produce even larger output swings.

Figure 4:
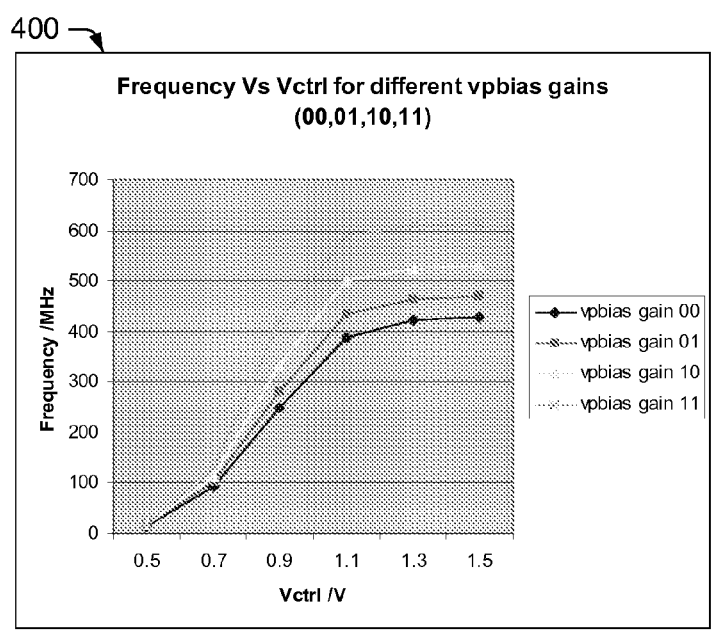
FIG. 4 is a graph illustrating an exemplary voltage vs. frequency characteristic of the delay cell of FIG. 3.

Graph 400 shown in FIG. 4 illustrates exemplary control voltage ($V_{CTRL}$) vs. frequency characteristics of delay cell 300 over a plurality of programmable gain settings (00 to 11). By comparing FIGS. 2 and 4, it becomes clear that delay cell 300 provides a much larger frequency range than delay cell 100. This is because delay cell 300 can tolerate substantially larger current variation (i.e., output swing) than delay cell 100. Frequency is proportional to current. Therefore, larger current variation translates into a larger frequency range.

In addition to better noise performance, reduced area consumption and improved output swing and frequency range, delay cell 300 requires only one bias voltage (vpbias) to be supplied to the gate terminals of the current source devices (MP2, MP3), as opposed to the two bias voltages (vpbias and vprbias) shown in FIG. 1. As such, delay cell 300 may save additional current and area in the bias generation block (FIG. 9) of a voltage controlled oscillator (VCO) when incorporated within a phase locked loop (PLL) device. Similar current and area savings may be achieved in the bias generation block (FIG. 10) of a delay locked loop (DLL) device.

Figure 7:
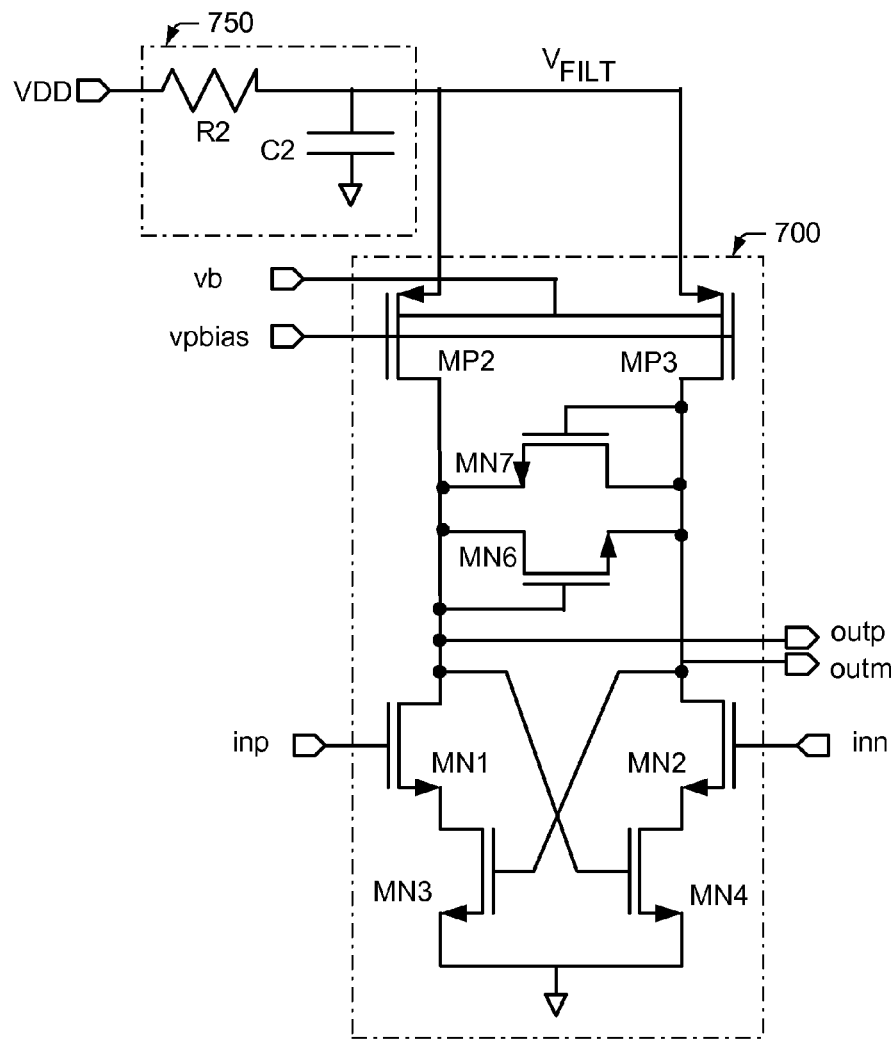
FIG. 7 is a simplified circuit schematic illustrating a differential delay cell, according to one alternative embodiment of the invention.

It is noted that FIG. 3 illustrates only one embodiment of an improved delay cell architecture. Other embodiments are possible. For example, FIG. 7 illustrates one alternative embodiment 700 in which two back to back diode-connected swing limiting devices (MN6, MN7) are used in place of the single swing limiting device (MN5) shown in FIG. 3. The diode-connected devices could be implemented, for example, with low voltage threshold (VT) devices or any combination of MOS devices.

As shown in FIG. 7, the diode-connected devices (MN6, MN7) are coupled between the output nodes (outp, outn) in a manner similar to swing limiting device MN5. However, the gate terminals of the diode-connected devices are not connected for receiving the filtered power supply voltage, as described in the previous embodiment. Instead, the gate and drain terminals of diode-connected device MN6 are connected to one output node (e.g., outp), while the source terminal of the diode-connected device MN6 is connected to the other output node (e.g., outn). The reverse applies to diode-connected device MN7. Connecting the swing limiting devices (MN6, MN7) in such a manner guarantees that the output swing will not deviate too far from its intended value by disconnecting the output nodes from the power supply. As noted above, for example, the gate terminal of swing limiting device (MN5) is connected for receiving the filtered power supply voltage. Although RC filter 350 reduces power supply variations to some degree, they may not be completely eliminated. Any remaining variation in VDD will vary the on resistance of the MN5 device, causing the output swing to change. The diode-connected devices (MN6, MN7) avoid such change by connecting the gate and drain terminals of the devices to the output nodes.

In another alternative embodiment, delay cell 300 and/or delay cell 700 may be implemented with a different process technology other than the CMOS technology specifically shown in FIGS. 3 and 7. One skilled in the art would understand how the delay cell architecture could be modified to include alternative process technologies (such as bipolar technologies).

Figures 5, 6:
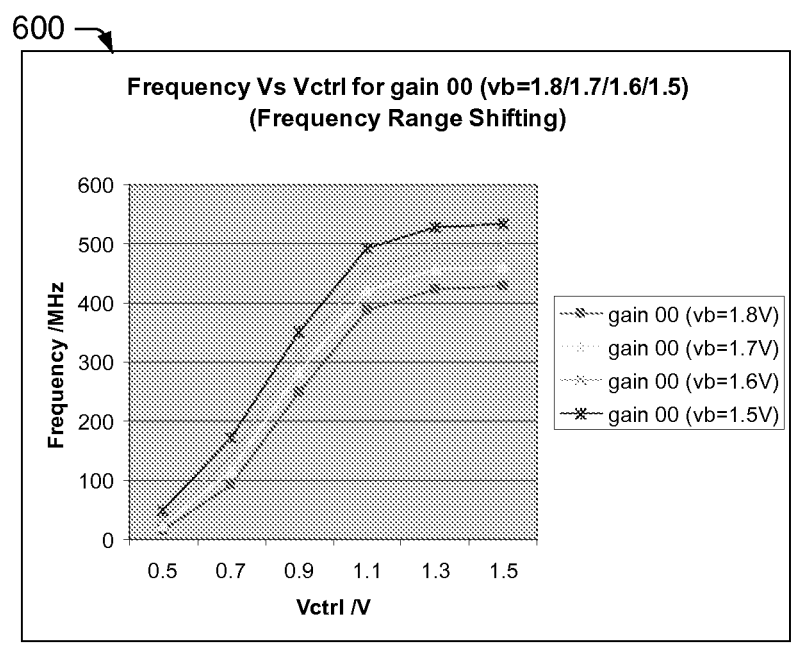
FIG. 5 is a table illustrating exemplary ways in which the size of a swing limiting device (MN5) in the delay cell of FIG. 3 may be varied to alter the output swing of the delay cell.
FIG. 6 is a graph illustrating exemplary ways in which the bulk bias voltage (vb) supplied to current source devices (MP2, MP3) in the delay cell of FIG. 3 may be varied to shift the frequency range of the delay cell.

In another alternative embodiment, the size of swing limiting devices (e.g., MN5, MN6 and/or MN7) may be altered to adjust the output swing of the delay cell. For example, table 500 of exemplary widths and lengths for the MN5 device is shown in FIG. 5. Table 500 includes only a small sampling of possible widths and lengths. However, the table illustrates that larger output swings may be obtained by increasing the length of the MN5 device. As used herein, the "length" of a transistor is described as the physical dimension of the transistor gate in the axis from source to drain. On the other hand, smaller output swings may be obtained by increasing the width of the MN5 device. As used herein, the "width" of a transistor is described as the physical dimension of the transistor gate in the axis perpendicular to the source to drain. In one embodiment, different sized devices could be "switched in" with logic to vary the output swing within pre-programmed limits.

In another alternative embodiment, a bias voltage (not shown) may be supplied to the gate terminal of the swing limiting device(s) to vary the output swing of the delay cell. For example, a bias voltage may be supplied to the gate terminal of the MN5 device, as mentioned above. The bias voltage may then be altered to change the ON impedance of the device. This would change the amount of current flowing through the device, which in turn, would cause the output swing to change. However, an additional bias voltage would necessarily increase the current requirements of a PLL/DLL incorporating the delay cell and may introduce an additional noise source (i.e., from the bias). As such, it may not be desirable to supply a bias voltage (not shown) to the swing limiting device(s) in all embodiments.

In another alternative embodiment, an optional bias voltage (vb) may be supplied to the bulk terminals of current source devices MP2 and MP3. In some cases, the bulk bias voltage may be adjusted to provide the delay cell with additional current limiting and/or frequency range shifting. Graph 600 shown in FIG. 6 includes only a small sampling of possible bulk bias voltages (for a particular gain setting) that may be supplied to the current source devices (MP2, MP3). However, the graph indicates that the frequency range may be increased by decreasing the bulk bias voltage (vb) supplied to MP2 and MP3. Although the frequency range can be extended by supplying an additional bias voltage (vb) to the delay cell, it does so at the cost of current consumption. As indicated above, the use of an additional bias voltage (vb) increases the amount of current consumed by a bias generation block included within an electronic device for generating the bias voltages. As such, the additional bias voltage (vb) supplied to the bulk terminals of the current source devices is considered to be an optional feature of the delay cell architecture and may not be used in all embodiments of the invention.

Figure 8:
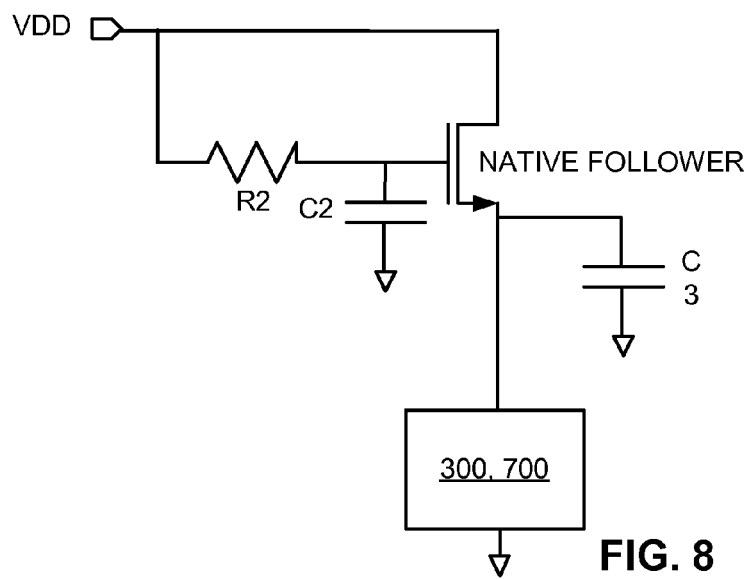
FIG. 8 is a simplified circuit schematic illustrating a differential delay cell, according to another alternative embodiment of the invention.

In another alternative embodiment, RC filters 350 and 750 shown in FIGS. 3 and 7, respectively, may be modified to increase or decrease the amount of filtering provided thereby. As shown in FIG. 8, for example, a native follower device and capacitor may be added to the RC components shown in FIGS. 3 and 7 to provide significantly more low-pass filtering. As used herein, a native follower device may be described as any transistor with a zero threshold voltage. The current embodiment utilizes a native NMOS device. One skilled in the art, however, would recognize how the filter could be modified to include other zero threshold voltage devices or, in some cases, transistors with threshold voltages greater than zero.

As shown in FIG. 8, the drain of the native NMOS device may be directly connected to the power supply voltage (VDD). The RC components (R2, C2) shown in FIGS. 3 and 7 are coupled between VDD and the gate terminal of the native NMOS device for supplying a somewhat reduced voltage thereto (due to the IR drop across the large resistor). The additional capacitor (C3) is coupled between the source terminal of the native NMOS device and ground. In some cases, a relatively large amount of additional filtering may be provided by using a FET with a large on resistance (such as a native NMOS device) and a small capacitor (C3). The source terminal of the native NMOS device is connected to the mutually-coupled source terminals of the current source devices (MP2 and MP3) for supplying the filtered power supply voltage ($V_{FILT}$) thereto.

Use of the native follower device provides more filtering than the RC components alone, which in turn, enables a larger resistor (R2) to be used within the RC filter to improve noise rejection and save area. In other words, the native NMOS device may be used along with the delay cell architectures 300 and 700 shown in FIG. 3 or 7, respectively, when additional filtering is desired. Use of the native NMOS device is made possible due to the extra headroom gained in the delay cell architectures. Because there is no IR drop at the gate of the native NMOS device, a relatively large resistance (R2) can be used to provide a large RC product, and thus, good filtering characteristics. The additional capacitor (C3) at the source of the native NMOS forms another filter with the drain resistance of the native NMOS device. In most cases, the filtering provided by the additional capacitor and drain resistance may also be quite large.

Figure 9:
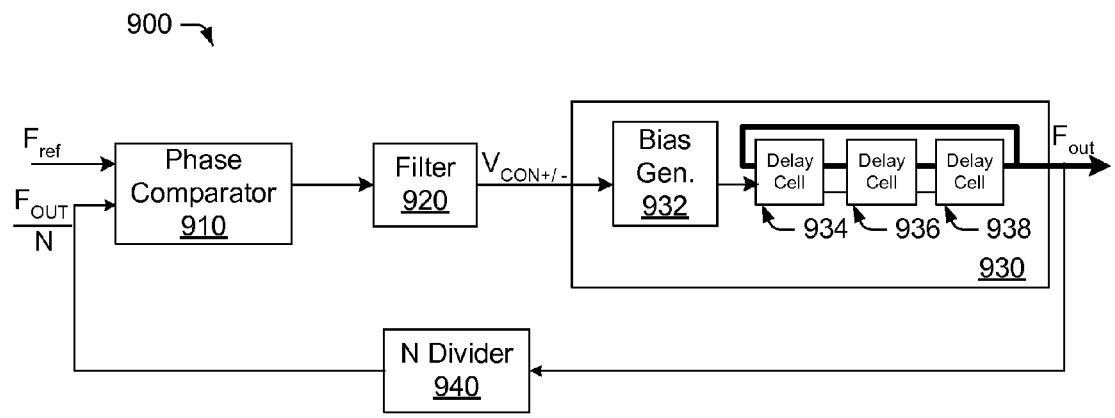
FIG. 9 is a block diagram of an exemplary phase locked loop (PLL) device comprising the delay cell of FIG. 3.
Figure 10:
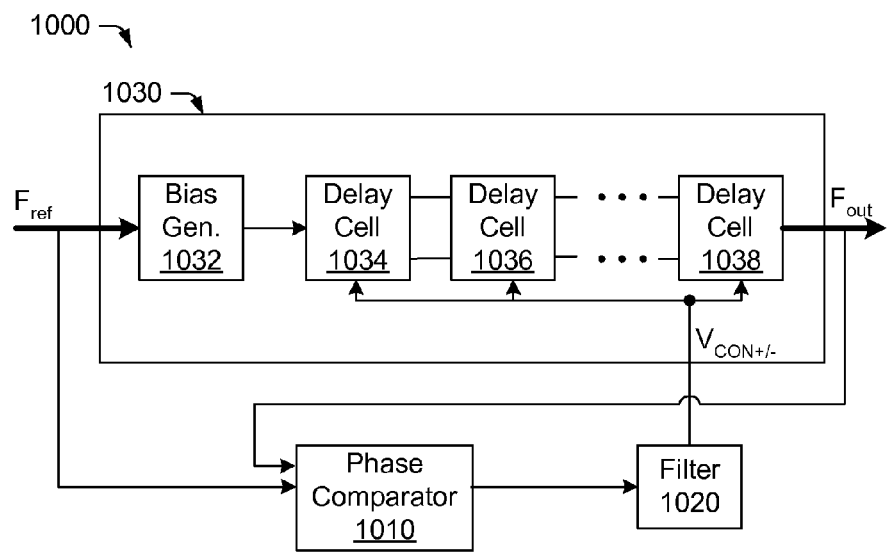
FIG. 10 is a block diagram of an exemplary delay locked loop (DLL) device comprising the delay cell of FIG. 3.

In some embodiments, the improved delay cell architectures shown in FIG. 3, 7, or 8 may be included within the voltage controlled oscillator (VCO) of a PLL device or the delay line of a DLL device. FIGS. 9 and 10 illustrate exemplary embodiments of a PLL device and DLL device, respectively. However, one skilled in the art would understand that the improved delay cell architecture shown in FIG. 3 is not limited to PLLs or DLLs, and may be included within any application that requires or benefits from accurate analog delays.

FIG. 9 illustrates one embodiment of a PLL device 900. In the illustrated embodiment, PLL 900 includes a phase comparator 910, a loop filter 920, a voltage controlled oscillator (VCO) 930 and an optional frequency divider 940. Phase comparator 910 compares the phase of the feedback signal ($F_{OUT}$/N) to the reference signal ($F_{REF}$) and generates an error signal, or phase correction signal. In some cases, phase comparator 910 may include a phase frequency detector and a charge pump; however, a voltage pump may be alternatively used. Loop filter 920 filters the error signal generated by phase comparator 910. The optional frequency divider 940 divides the frequency of the VCO output signal ($F_{OUT}$) to produce the feedback signal ($F_{OUT}$/N). In the embodiments that include frequency divider 940, PLL 900 may function as a frequency multiplier. However, frequency divider 940 may not be included in all embodiments of the invention. In such embodiments, the VCO output signal may be directly fed back to phase comparator 910.

As shown in FIG. 9, VCO 930 may include a bias generation block 932 and a number of differential delay cells 934, 936, and 938 coupled, e.g., in a ring configuration. Though three delay cells are illustrated in the embodiment of FIG. 9, any number of delay cells may be alternatively used. An odd number is shown because an odd number of inversions are used to make the ring oscillate. However, an even number of delay cells may be alternatively used to generate a desired free-running frequency, with some delay cells implementing buffers and some delay cells implementing inverters. Each differential delay cell within VCO 930 has differential outputs connected to the differential inputs of a subsequent differential delay cell. Likewise, each differential delay cell has differential inputs coupled to the differential outputs of a previous differential delay cell. An inverter is formed if the polarity of the outputs is different from the polarity of the inputs. Conversely, a buffer is formed if the polarity of the outputs is similar to the polarity of the inputs.

In the embodiment of FIG. 9, each of the differential delay cells within VCO 930 is coupled to receive a differential control input ($V_{con+/-}$) from a differential charge pump (or voltage pump) and loop filter. In some embodiments, a differential driver (not shown) may be included within VCO 930 for producing a differential control input from a single-ended control input. In other embodiments, however, the single-ended control input may be supplied directly to the delay cells. In any case, changing the voltage(s) supplied to the control input(s) modifies the delay generated by the differential delay cells and adjusts the VCO output frequency.

In some cases, differential delay cells 934, 936 and 938 shown in FIG. 9 may be implemented with the delay cell architecture shown in FIG. 1. However, use of delay cell architecture 100 may not allow PLL 900 to meet certain design specifications. For example, the S8 PSOC3 PLL designed by Cypress Semiconductor requires relatively low current (e.g., less than about 800 uA), small area (e.g., less than about 117K) and low jitter (e.g., less than about 800 ps total jitter at 24 MHz output clock). If delay cell 100 were used, the PLL design would consume approximately 880 uA of current (about 10% larger than the spec), more than 200 kum$^2$ of area (about 30% larger than the spec) and approximately 1.24 ns of deterministic jitter at an oscillation frequency of 24 MHz (about 50% larger than the spec). It is noted, however, that the numbers mentioned above are both process and design specification dependent.

Therefore, delay cell 300 or 700 may be used, in preferred embodiments of the invention, to meet and/or exceed the low current, small area and low jitter specifications mentioned above. In one embodiment, delay cell 700 may consume approximately 23% less current and 58% less area, while providing better deterministic jitter (e.g., 90% better $J_{DET}$ at $F_{OSC}$=100 MHz, 70% better $J_{DET}$ at $F_{OSC}$=24 MHz), better phase jitter (e.g., 7% better $J_{PHASE}$ at $F_{OSC}$=100 MHz) and 21% better output swing than delay cell 100. The improvement in deterministic jitter may be attributed to the larger resistance (R2) used in the RC filter of FIG. 7 (due to the additional headroom gained by removing PMOS current source MP1). Phase jitter may also be improved by eliminating the PMOS current source. For example, removing MP1 eliminates flicker noise and reduces thermal noise, due to fact that the current source devices MP2 and MP3 of FIG. 7 may have a significantly smaller transconductance (gm) than the large current source MP1 used in FIG. 1. In some cases, delay cell 700 may also simplify the bias generation block (e.g., 932) and reduce current consumption by requiring only one bias voltage (vpbias).

FIG. 10 illustrates one embodiment of a delay-locked loop 1000 including a phase comparator 1010, a loop filter 1020 and a delay line 1030. Phase comparator 1010 compares the phase of the feedback signal ($F_{OUT}$) to the phase of the reference signal ($F_{REF}$) and generates an error signal, or phase correction signal. Loop filter 1020 filters the error signal and adjusts the delay generated by delay line 1030 by supplying a differential control input ($V_{con+/-}$) or single ended control input (not shown) to delay line 1030. The combined actions of phase comparator 1010 and filter 1020 cause delay line 1030 to produce a delay, which is substantially equal to an integer number of the reference periods.

Delay line 1030 may include any number of differential delay cells in accordance with the present invention. Although three delay cells 1034, 1036, and 1038 are illustrated in the embodiment of FIG. 10, any number of delay cells may be alternatively used. In general, delay line 1030 receives an input signal ($F_{REF}$) and outputs a delayed version ($F_{OUT}$) of the input signal. In particular, delay line 1030 receives a differential input signal ($F_{REF}$) and a differential control signal ($V_{con+/-}$) for producing a differential output signal ($F_{OUT}$). The differential control signal ($V_{con+/-}$) provided to delay line 1030 may be produced by a differential control pump (or voltage pump) and loop filter. In an alternative embodiment, delay line 1030 may include a differential driver (not shown) for producing a differential control signal from a single-ended control signal. In yet another alternative embodiment, a single-ended control signal may be supplied to delay line 1030.

In preferred embodiments of the invention, the differential delay cells shown in FIG. 10 may be implemented with the delay cell architecture shown in FIGS. 3 and 7. This may enable DLL 1000 to consume significantly less current and area, while providing better deterministic jitter, phase jitter and output swing than a DLL incorporating delay cell 100.

It will be appreciated to those skilled in the art having the benefit of this disclosure that this invention is believed to provide a differential delay cell, which overcomes the disadvantages of conventional delay cells. For example, the delay cell architectures shown in FIGS. 3 and 7 improve upon the delay cell shown in FIG. 1 by removing the PMOS current source (MP1, FIG. 1) and inserting at least one swing limiting device (e.g., MN5, or MN6 and MN7) between the output nodes of the delay cell. Removing the PMOS current source (MP1, FIG. 1) enables the output signals generated by delay cells 300 and 700 to swing almost rail to rail.

In one embodiment, removing the PMOS current source may provide up to 33% more swing than the embodiment shown in FIG. 1. The extra headroom created by removing the PMOS current source enables a significantly larger resistor to be used in the RC filter 350/750 (FIGS. 3 and 7, respectively) coupled to the delay cell. In one embodiment, the resistor (R2) used in the RC filter of FIGS. 3 and 7 may be approximately 6 times larger than the resistor (R1) used in the RC filter of FIG. 1. The use of a large resistor provides a significant reduction in deterministic jitter. The additional filtering provided by the larger resistor also enables a smaller capacitor (e.g., C2 may be approximately 6 times smaller than C1) to be used in the RC filter of FIGS. 3 and 7, which reduces area consumption. Eliminating the PMOS current source (MP1) also reduces phase-induced jitter by eliminating the flicker noise and thermal noise generated thereby.

Further modifications and alternative embodiments of various aspects of the invention will be apparent to those skilled in the art in view of this description. For example, the differential delay cell described herein may be utilized in substantially any other device (besides PLL/DLLs) that benefits from accurate analog delays. It is intended, therefore, that the following claims be interpreted to embrace all such modifications and changes and, accordingly, the specification and drawings are to be regarded in an illustrative rather than a restrictive sense.

What is claimed is:

1. A differential delay cell having a pair of input nodes and a pair of output nodes, the differential delay cell comprising:
    a pair of current source transistors, each with a drain terminal connected to a different one of the output nodes;
    at least one swing limiting transistor connected between the drain terminals of the current source transistors; and
    a resistor-capacitor (RC) filter connected to source terminals of the current source transistors and a gate terminal of the at least one swing limiting transistor for supplying a reduced power supply voltage thereto, wherein the RC filter further comprises a native follower device and an additional capacitor coupled between a source terminal of the native follower device and ground, and wherein the native follower device comprises (i) a gate terminal coupled for receiving a filtered power supply voltage from a resistor of the RC filter and a capacitor of the RC filter.

2. The differential delay cell as recited in claim 1, further comprising:
   a pair of input transistors, each coupled to a different one of the output nodes for generating a pair of output signals based on a pair of input signals supplied to the input nodes of the differential delay cell; and
   a pair of cross-coupled transistors, each coupled between a different one of the input transistors and ground for amplifying the output signals generated at the output nodes.

3. The differential delay cell as recited in claim 1, wherein gate terminals of the current source transistors are coupled together for receiving a first bias voltage, which is programmable for controlling current flow through the current source transistors, and therefore, setting an operating frequency range of the delay cell.

4. The differential delay cell as recited in claim 3, wherein bulk terminals of the current source transistors are coupled together for receiving a second bias voltage, which is programmable for adjusting the operating frequency range of the delay cell.

5. The differential delay cell as recited in claim 1, wherein the native follower device further comprises: (ii) a drain terminal coupled for receiving the power supply voltage, and (iii) a source terminal coupled for supplying the reduced power supply voltage to the source terminals of the current source transistors and the gate terminal of the at least one swing limiting transistor.

6. A differential delay cell, comprising:
   a resistor-capacitor (RC) filter configured to filter a power supply voltage supplied to the delay cell, the RC filter comprising a native follower device and an additional capacitor coupled between a source terminal of the native follower device and ground, wherein a gate terminal of the native follower device is coupled for receiving the filtered power supply voltage from a resistor of the RC filter and a capacitor of the RC filter;
   a first current leg consisting essentially of a first current source transistor, a first input transistor and a first load transistor connected in series between the RC filter native follower device and ground;
   a second current leg consisting essentially of a second current source transistor, a second input transistor and a second load transistor connected in series between the RC filter native follower device and ground;
   at least one swing limiting transistor coupled between the first and second current legs, wherein a gate terminal of the at least one swing limiting transistor is connected to the RC filter native follower device for receiving the filtered power supply voltage; and
   a programmable bias voltage supplied to mutually-coupled gate terminals of the first and second current source transistors for controlling current flow through the first and second current legs and setting an operating frequency range of the differential delay cell.

7. The differential delay cell as recited in claim 6, further comprising an additional programmable bias voltage supplied to mutually coupled bulk terminals of the first and second current source transistors for adjusting the operating frequency range of the differential delay cell.

8. The differential delay cell as recited in claim 6, wherein the at least one swing limiting transistor comprises a pair of diode-connected swing limiting transistors, each coupled in parallel between the first and second current legs.

9. The differential delay cell as recited in claim 6, wherein the first and second current source transistors comprise: (i) source terminals, each of which is connected to the RC filter native follower device for receiving the filtered power supply voltage, and (ii) drain terminals, each of which is connected to a drain terminal of a different one of the first and second input transistors.

10. The differential delay cell as recited in claim 6, wherein the first and second input transistors comprise: (i) drain terminals, each of which is connected to a drain terminal of a different one of the first and second current source transistors, (ii) source terminals, each of is connected to a drain terminal of a different one of the first and second load transistors, and (iii) gate terminals, each of which is coupled for receiving a differential input signal supplied to the differential delay cell.

11. The differential delay cell as recited in claim 6, wherein the first and second load transistors comprise: (i) drain terminals, each of which is connected to a source terminal of a different one of the first and second input transistors, (ii) source terminals, which are coupled together and connected to ground, and (iii) gate terminals, which are cross-coupled and connected to the drain terminals of the first and second input transistors.

12. A circuit, comprising:
   a plurality of differential delay cells configured to receive a filtered power supply voltage from a resistor-capacitor (RC) further comprising a native follower device and an additional capacitor coupled between a source terminal of the native follower device and ground, wherein a gate terminal of the native follower device is coupled for receiving the filtered power supply voltage from a resistor of the RC filter and a capacitor of the RC filter, and wherein each delay cell comprises:
      a pair of current source transistors having mutually-coupled source terminals connected to the RC filter native follower device, mutually-coupled gate terminals connected to a bias voltage, and each with a drain terminal connected to a different output node of the delay cells; and
      at least one swing limiting transistor connected between the drain terminals of the current source transistors, wherein a gate terminal of the at least one swing limiting transistor is connected to the RC filter native follower device for receiving the filtered power supply voltage; and
   a bias generation block configured to supply the bias voltage to the mutually coupled gate terminals of the current source transistors for controlling current flow through each of the delay cells, and as a result, setting an operating frequency range of the circuit.

13. The circuit as recited in claim 12, wherein the at least one swing limiting transistor comprises a pair of diode-connected transistors coupled in parallel between the drain terminals of the current source transistors.

14. The circuit of claim 12, wherein the bias generation block is configured for generating only one additional bias voltage, which is supplied to bulk terminals of the current source transistors for adjusting the operating frequency range of the circuit.

15. The circuit of claim 12, wherein the circuit comprises a voltage controlled oscillator (VCO) included within a phase locked loop (PLL) device.

16. The circuit of claim 12, wherein the circuit comprises a delay line included within a delay locked loop (DLL) device.

* * * * *